United States Patent [19]
Audic et al.

[11] Patent Number: 6,002,223
[45] Date of Patent: Dec. 14, 1999

[54] CONTROL CIRCUIT FOR AN ELECTRIC MOTOR

[75] Inventors: Jean-Philippe Audic, Caen; Stéphane Bouvier, Cairon, both of France

[73] Assignee: U.S. Philips Corporation, New York, N.Y.

[21] Appl. No.: 09/021,259

[22] Filed: Feb. 10, 1998

[30] Foreign Application Priority Data

Feb. 14, 1997 [FR] France ................................. 97 01748

[51] Int. Cl.$^6$ ............................................... H02K 23/00
[52] U.S. Cl. .................... 318/254; 318/434; 318/138; 318/801; 318/802; 318/798; 318/439; 437/32; 327/110
[58] Field of Search ............................. 327/110; 318/434, 318/138, 801, 802, 798, 439, 254; 437/32; 323/313

[56] References Cited

U.S. PATENT DOCUMENTS

| | | | |
|---|---|---|---|
| 4,929,884 | 5/1990 | Bird et al. ............................... | 323/313 |
| 5,377,094 | 12/1994 | Willimas et al. ........................ | 318/434 |
| 5,508,874 | 4/1996 | Williams et al. ......................... | 361/92 |
| 5,679,587 | 10/1997 | Zambrano ................................ | 437/32 |
| 5,811,996 | 9/1998 | Oyabe et al. ............................ | 327/110 |

FOREIGN PATENT DOCUMENTS 02116157A 4/1990 Japan .

OTHER PUBLICATIONS

"Smart Power ICS", SGS–Thomson, ISBN 3–S40–60332–8.

Primary Examiner—Karen Masih
Attorney, Agent, or Firm—Bernard Franzblau

[57] ABSTRACT

A control circuit controls the power supply to an electric motor and, comprises a power transistor NM of the NMOS type and a power transistor PM of the PMOS type arranged between two supply terminals VCC and GND, their intermediate node forming an output coupled to a coil Ei of the motor. The well B of the transistor PM is coupled to supply terminal VCC via an isolation diode ID, which has its anode connected to supply terminal VCC and has its cathode connected to the well B. The isolation diode ID ensures that the coil Ei is not short-circuited by the parasitic drain-well diode D of the transistor PM in case of a sudden power failure.

9 Claims, 2 Drawing Sheets

CONTROL CIRCUIT FOR AN ELECTRIC MOTOR

BACKGROUND OF THE INVENTION

The present invention relates to a control circuit intended to control the flow of a current through a coil of an electric motor in order to produce a magnetic field which sets the motor into motion, said coil being coupled to an output terminal of the circuit, which circuit is arranged between a positive supply terminal and a negative supply terminal and comprises:

- a power transistor of the NMOS type arranged between the negative supply terminal and the output terminal, and
- a power transistor of the PMOS type arranged between the output terminal and the positive supply terminal, said transistor being implanted in a well with an N-type diffusion, which is electrically coupled to the positive supply terminal, the conduction of the power transistors of the PMOS type and of the NMOS type being controlled by complementary signals.

Such control circuits are generally used for the control of devices utilizing information storage discs, particularly hard discs for information processing equipment. These devices usually have a first motor, which serves to impart a rotary movement to the disc, and a second motor, which serves to move an arm carrying one or more heads for reading/writing information from the surface of the disc. Each motor has input terminals, called supply terminals, which are coupled to coils intended to produce a magnetic field by means of which the motor can be driven. Each of the supply terminals is coupled to the output terminal of a control circuit. In the event of a sudden power failure, i.e. when the positive supply voltage becomes zero while the device is in operation, the rotor of the first motor continues to rotate, driven by its kinetic energy, and produces an electromotive force across the supply terminals of this motor, which then operates as a generator. This electromotive force, which takes the place of the supply voltage of the second motor, should allow the motor to move the arm towards a disc zone, called parking zone, which has been provided to allow the arm to be parked there without damage being caused to the read/write heads.

However, it has been found that the PN junction existing between the drain of a PMOS power transistor and the well in which this transistor is implanted forms a parasitic diode. When the voltage on the positive supply terminal is zero, the well being usually coupled to the source, which itself is coupled to this positive supply terminal, said parasitic diode short-circuits the motor terminal to which it is coupled via the output terminal of the control circuit, thereby allowing a substantial leakage current to flow directly to a terminal at zero potential. This prevents the electromotive force produced by the first motor from being used for energizing the second motor. Various solutions have been proposed to solve this problem, which essentially comprise the insertion of a power component by means of which the leakage current between the source of the PMOS transistor and the positive supply terminal can be blocked in one direction. For example, in the solution described in the publication ISBN 3-540-60332-8 "Smart Power ICs" by SGS-Thomson, a power diode has its cathode coupled to the source of the PMOS transistor and has its anode coupled to the positive supply terminal. This solution has two major drawbacks: such a power component is expensive and a substantial voltage drop is produced across it. Indeed, the value of the supply voltage in the normal mode of operation is currently of the order of 5 V and constantly much development effort is deployed to reduce this value with a dual general purpose of saving energy and reducing the size of electronic circuits. Since a voltage drop of the order of 0.5 V is produced across the power diode in a most advantageous case where the diode is of the Schottky type, this diode reduces the useful power supplied to the motor and, consequently, the energy efficiency of the device by at least 10%, which adverse effect of the power diode on the efficiency is bound to increase as the value of the supply voltage decreases.

SUMMARY OF THE INVENTION

It is an object of the present invention to mitigate these two drawbacks at the same time by proposing a solution which utilizes a cheap component which is arranged in such a manner that, in normal operation, it does not affect the routing of energy from the positive supply terminal to the motor controlled by the control circuit.

To this end, according to the present invention, a control circuit of the type defined in the opening paragraph is characterized in that the well of the power transistor of the PMOS type is coupled to the positive supply terminal via a diode called isolation diode, which isolation diode has its anode connected to the positive supply terminal and has its cathode connected to the well.

In this control circuit the power is routed directly to the output terminal via the PMOS power transistor, in the normal mode of operation. The isolation diode comes into action only when the voltage on the positive supply terminal is smaller than the voltage on the output terminal by one threshold voltage, which is typically of the order of 0.7 V. The parasitic diode formed by the drain-well junction is then potentially conductive to allow the passage of a leakage current but this current is blocked by the reverse-biased isolation diode. Since this precludes any possibility of a short-circuit, the electromotive force produced by the motor can then be used as a backup supply voltage until exhaustion of the kinetic energy of the rotor of the motor.

As set forth hereinbefore, it is necessary to use several control circuits for controlling a motor having a plurality of supply terminals. The invention therefore also relates to a control circuit for an electric motor having at least two terminals coupled to at least one coil intended to produce, when energized, a magnetic field which sets the motor into motion, the circuit comprising a control stage having at least two output terminals, each coupled to one of the motor terminals, a positive supply terminal and a negative supply terminal, and comprising at least two branches, each having a power transistor of the NMOS type arranged between the negative supply terminal and one of the output terminals, and a power transistor of the PMOS type arranged between said output terminal and the positive supply terminal, which transistor is implanted in a well with N-type diffusion, which well is electrically coupled to the positive supply terminal, the conduction of the power transistors of the PMOS type and of the NMOS type of a branch being controlled by complementary signals, characterized in that each of the wells of the power transistors of the PMOS type is coupled to the positive supply terminal via a diode called isolation diode, which isolation diode has its anode connected to said positive supply terminal and has its cathode connected to said well.

In a variant of such a control circuit all the wells of the power transistors of the PMOS type are coupled to the positive supply terminal via a common isolation diode.

This variant is interesting from an economic point of view because it requires the use of only one isolation diode for the entire control circuit.

As stated hereinbefore, the structure of the control circuit in accordance with the invention makes it particularly suitable for the control of motors in devices using information storage discs. In a particularly advantageous embodiment, the invention therefore also relates to a circuit for controlling an information storage disc, intended to control a first motor and a second motor, each having at least two terminals coupled to at least one coil intended to produce, when energized, a magnetic field which sets the motor into motion, the first motor being intended to impose a rotary movement upon the disc and the second motor being intended to move an arm carrying at least one information read/write head over the surface of the disc, characterized in that it comprises a first and a second control circuit as described above, each of the output terminals of the first and the second control circuit being coupled, respectively, to one of the terminals of the first and the second motor, all the wells of the power transistors of the PMOS type being coupled to the positive supply terminal via a common isolation diode, one of the output terminals of the second control circuit being coupled to the cathode of the isolation diode via a power transistor of the PMOS type, called a parking transistor, which is intended to be turned on in case of a sudden power failure, between a first instant, at which the voltage on the positive supply terminal becomes zero, and a second instant, at which the voltage across the first motor becomes zero.

In the normal mode of operation the voltage on the positive supply terminal is routed from this terminal to the motor via the power transistors of the PMOS type. In case of a sudden power failure the parking transistor is turned on and makes it possible to supply the second motor with the power required for moving the arm carrying the read/write heads to a parking zone, the energy being provided by the electromotive force produced on the supply terminals of the first motor, which then functions as a generator. The isolation diode precludes any leakage of energy to the positive supply terminal via parasitic diodes formed by the drain-well junctions of the PMOS transistors.

In a variant of this control circuit the well of the parking transistor is coupled to the drain of this transistor.

This configuration makes use of the presence of a parasitic diode, which in the present case is formed by the source-well junction of the parking transistor. Indeed, if the well is coupled to the drain the PN junction forming said parasitic diode is disposed between the source and the well. When the kinetic energy of the rotor of the first motor becomes exhausted the value of the electromotive force produced by this motor decreases to a threshold below which it is no longer sufficient to sustain conduction of the parking transistor. The parasitic diode, which is then conductive, then allows the remainder of the energy delivered by the first motor to reach the second motor in the form of a current which flows through this diode.

The invention will be more fully understood with the aid of the following description of some embodiments, given by way of non-limitative examples, with reference to the accompanying drawings, in which:

DETAILED DESCRIPTION OF THE PREFERRED EMBODIMENTS

Figure 1:
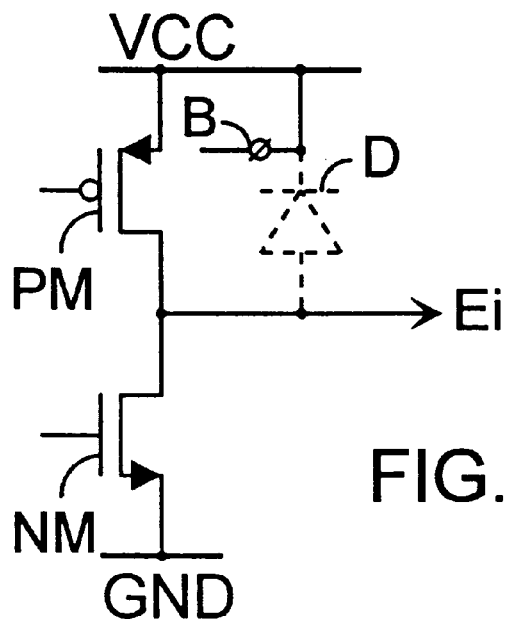
FIG. 1 is a diagram illustrating the basic architecture of a known control circuit.

FIG. 1 shows diagrammatically the basic architecture of a known control circuit, arranged between a positive supply terminal VCC and a negative supply terminal GND. This circuit is intended to control the flow of current through a coil Ei of an electric motor so as to produce a magnetic field which sets the motor into motion. The motor, which is well-known to those skilled in the art, is not shown in the Figure. The coil Ei is coupled to an output terminal of the circuit, which circuit comprises:

an NMOS power transistor NM arranged between the negative supply terminal GND and the output terminal, and a PMOS power transistor PM arranged between the output terminal and the positive supply terminal VCC, said transistor PM being implanted in a well with an N-type diffusion, which is electrically coupled to the positive supply terminal VCC. The conduction of the PMOS and NMOS power transistors is controlled by complementary signals, the transistors PM and NM being respectively turned on and turned off or turned off and turned on, depending on the nature of the magnetic field the coil Ei must produce. The diode D shown in broken lines is a parasitic diode formed as a result of the very construction of the transistor PM. Indeed, the source of this transistor has to be coupled to the point having the highest potential of the circuit, i.e. to the positive supply terminal VCC. The well B, shown as a solid line associated with a connection terminal, must be biased with a positive voltage, which is obtained by coupling it to the source of the transistor PM. Since the drain-well junction forms a PN junction, a parasitic diode D is formed, which has its cathode coupled to the positive supply terminal and its anode to the drain of the transistor PM, as is shown in FIG. 1. Whereas the influence of this parasitic diode D does not make itself felt in the normal mode of operation, in which the power is routed from the positive supply terminal VCC to the coil Ei via the source-drain path of the power transistor PM, it can become very harmful in case of a sudden power failure. The rotor of the motor, driven by its kinetic energy, then continues to rotate and produces across the coil Ei an electromotive force, which is to be used as a backup supply voltage during the time required to set the whole device including the control circuit and the motor to a rest position. Since the voltage on the positive supply terminal is now zero, it will be evident that the coil Ei is short-circuited by the diode D and that, consequently, the electromotive force generated across the coil Ei by the motor cannot be utilized.

Figure 2:
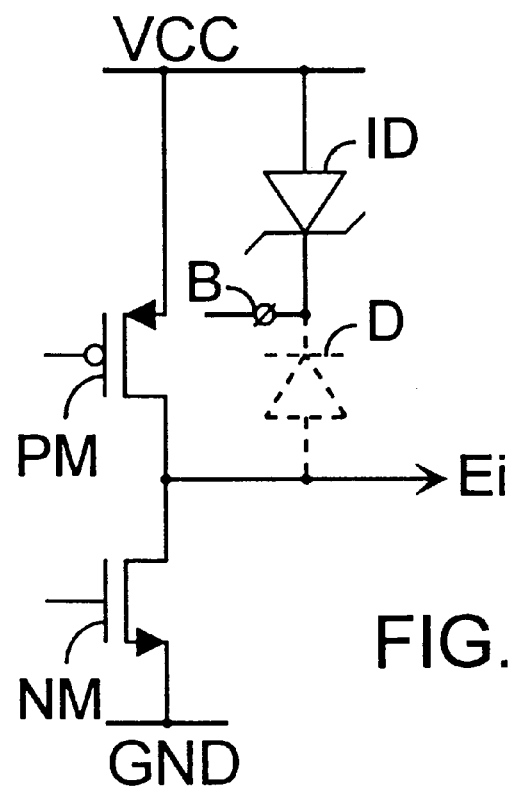
FIG. 2 is a diagram illustrating a control circuit in accordance with the invention.

FIG. 2 shows diagrammatically a control circuit in accordance with the invention. This control circuit also has the basic structure described above, the elements common to FIGS. 1 and 2 being given the same references for a better understanding of the description. In the present control circuit the well B of the power transistor PM is no longer coupled to the source of this transistor PM but is coupled directly to the positive supply terminal VCC via a so-called isolation diode ID whose anode is connected to the positive supply terminal VCC and whose cathode is connected to the well B. In this control circuit the power is routed directly to the coil Ei via the source-drain path of the power transistor PM, in the normal mode of operation. The isolation diode ID comes into action only when the voltage on the positive supply terminal VCC is smaller than the voltage on the output terminal by one threshold voltage of the diode D, which threshold voltage is typically of the order of 0.7 V. The parasitic diode D is then potentially conductive to allow the passage of a leakage current but this current is blocked by the reverse-biased isolation diode ID. Since this precludes any possibility of a short-circuit, the electromotive force produced across the coil Ei by the motor can then be used as a backup supply voltage until exhaustion of the kinetic energy of the rotor of the motor.

Figure 3:
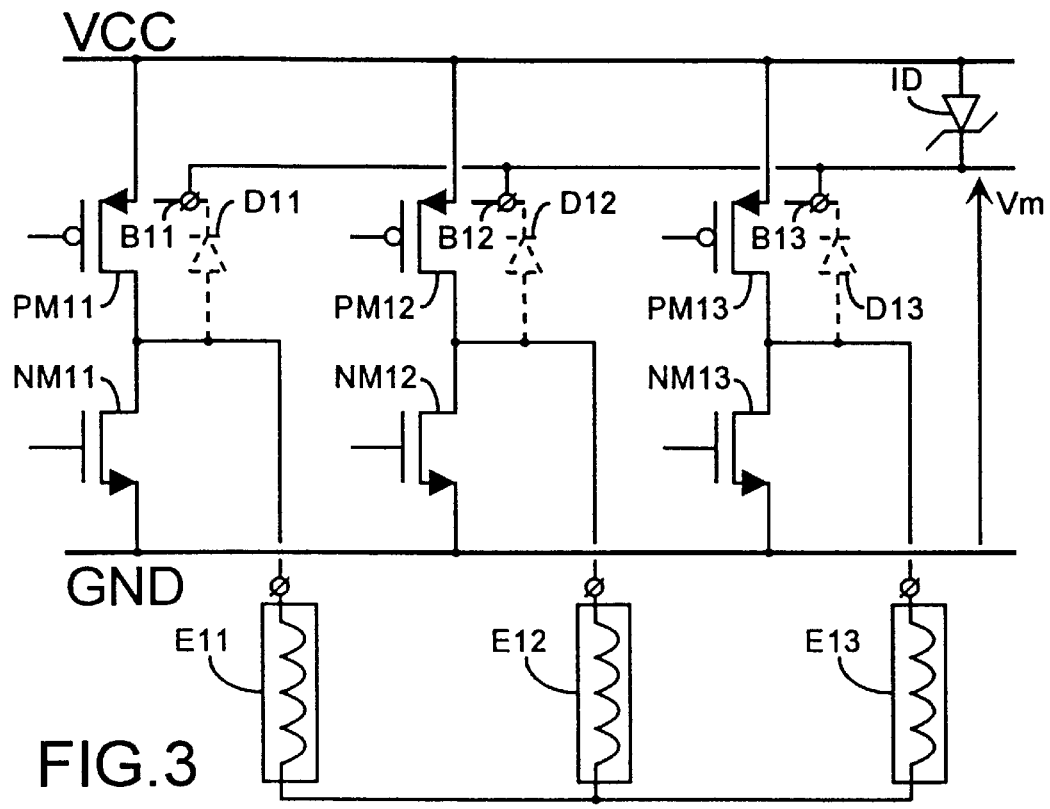
FIG. 3 is a diagram illustrating a control circuit for a motor intended to rotate an information storage disc.

FIG. 3 shows diagrammatically a first control circuit for a first motor intended to rotate an information storage disc. In the present example, the first motor, of which only the coils E11, E12 and E13 are shown, is a three-phase motor having three supply terminals, each coupled to one of said coils. The first control circuit thus comprises a control stage having three output terminals, which are each coupled to one of the terminals of the first motor, a positive supply terminal VCC and a negative supply terminal GND. The control stage has three branches each including an NMOS power transistor NM11, NM12 and NM13, respectively, arranged between the negative supply terminal GND and one of the output terminals, and a PMOS power transistor PM11, PM12 and PM13, respectively, arranged between said output terminal and the positive supply terminal VCC. These PMOS transistors PM11, PM12 and PM13 are implanted in wells B11, B12 and B13 with N-type diffusion, which wells are electrically coupled to the positive supply terminal VCC via a common isolation diode ID, which has its anode connected to this positive supply terminal VCC and which has its cathode connected to said wells. This isolation diode ID precludes the passage of leakage currents from the supply terminals of the first motor to the positive supply terminal VCC via the parasitic diodes D11, D12 and D13 formed by the drain-well junctions of the PMOS transistors PM11, PM12 and PM13. If the topography of the circuit allows so, the PMOS transistors PM11, PM12 and PM13 can be implanted advantageously in a common well. The conduction of the PMOS and NMOS power transistors is controlled by complementary signals in such a manner that at a given instant only two of the windings E11, E12 or E13 are energized in a sequence well-known to the specialist. In the event of a sudden supply voltage failure, i.e. when the potential on the positive supply terminal VCC becomes zero, the rotor of the first motor continues to rotate, driven by its kinetic energy, and thereby allows the first motor to produce an electromotive force on its supply terminals, the motor thus operating as a generator until the rotor stops. The energy thus developed results in a voltage Vm which appears between the cathode of the isolation diode and the negative supply terminal GND, which voltage Vm can be used as a backup supply voltage.

Figure 4:
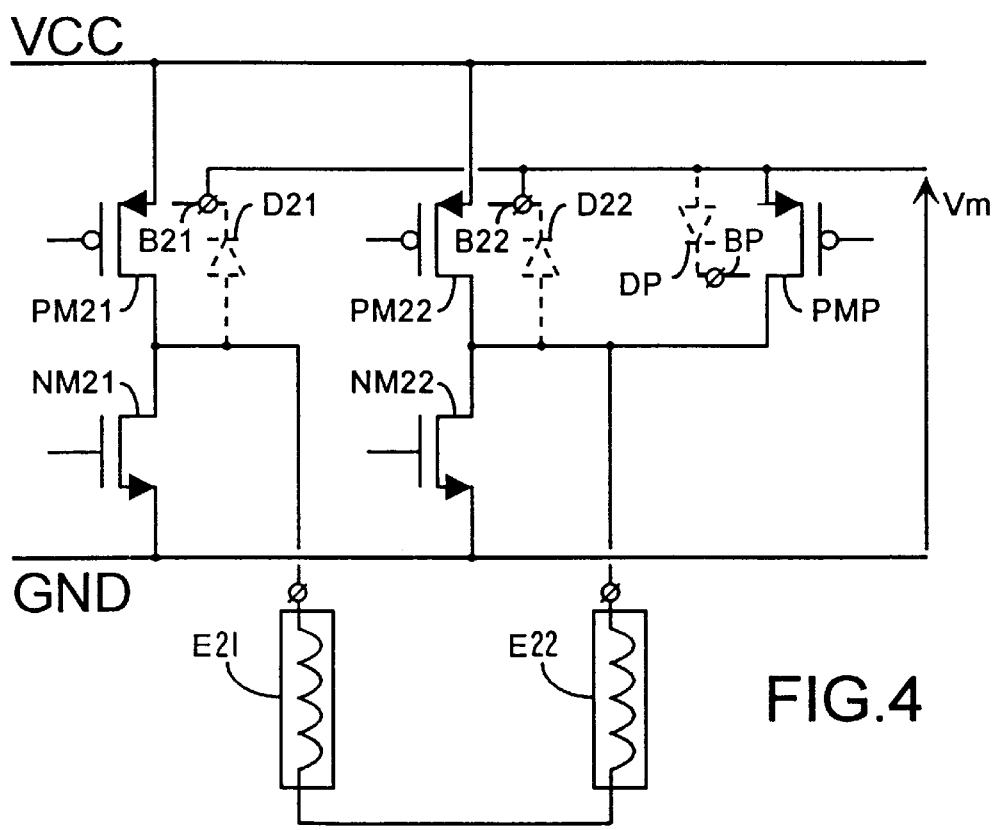
FIG. 4 is a diagram illustrating a control circuit for a motor intended to move an arm carrying a plurality of write/read heads over the surface of an information storage disc.

FIG. 4 shows diagrammatically a second control circuit for a second motor intended to move an arm carrying one or more read/write heads over the surface of an information storage disc. The second control circuit is advantageously added to the first one in a common integrated circuit, which can then control the entire device in which the information storage disc is used. In the present example, the second motor, of which only the two half-coils E21 and E22 are shown, is a two-phase motor having two supply terminals, each connected to one of said half-coils E21 and E22. The second control circuit thus comprises a control stage having two output terminals, which are each coupled to one of the terminals of the second motor, a positive supply terminal VCC and a negative supply terminal GND, which supply terminals VCC and GND are coupled to the supply terminals VCC and GND of the first control circuit. The control stage comprises two branches, each including an NMOS power transistor NM21 and NM22, respectively, arranged between the negative supply terminal GND and one of the output terminals, and a PMOS power transistor PM21 and PM22, respectively, arranged between said output terminal and the positive supply terminal VCC. These PMOS transistors PM21 and PM22 are implanted in wells B21 and B22 with N-type diffusion, which wells are electrically coupled to the positive supply terminal VCC via the isolation diode ID of the first control circuit. The isolation diode ID precludes the passage of leakage currents from the supply terminals of the second motor to the positive supply terminal via the parasitic diodes D21 and D22 formed by the drain-well junctions of the PMOS transistors PM21 and PM22. If the topography of the circuit allows it, the PMOS transistors PM21 and PM22 can be implanted advantageously in the same well, which may be the well which is common to the PMOS power transistors of the first control circuit. The conduction of the PMOS and NMOS power transistors of the same branch is controlled by complementary signals in such a manner that at a given instant only the PMOS transistor of one branch and the NMOS transistor of the other branch are conductive, the direction of the current flowing through the two half-coils determining the direction of movement of the arm. One of the output terminals of the second control circuit is coupled to the cathode of the isolation diode ID via a PMOS power transistor PMP, referred to as the parking transistor, which should be turned on in case of a sudden supply voltage failure, between a first instant, at which the voltage on the positive supply terminal VCC becomes zero, and a second instant, at which the voltage Vm across the first motor becomes zero, thus replacing the supply voltage of the second motor by the voltage Vm produced by the first motor. This structure ensures that the voltage Vm remains greaer than one diode's threshold voltage, i.e. typcially 0.7 V, during the arm's parking, which may prove useful in certain applications where a strong current is necessary to move the arm towards the parking zone. The choice of which of the output terminals of the second control circuit should be coupled to the parking transistor depends on the configuration of the information storage disc and, particularly, on the location of the parking zone. If, as is customary, this zone is disposed in the proximity of the center of the disc, where the tangential speed is minimal, that output terminal will be chosen which allows the arm to move to the center of the disc, which in the present example is the terminal coupled to the half-coil E22.

In the embodiment shown in FIG. 4, the well BP of the parking transistor PMP is coupled to the drain of this transistor. Consequently, a PN junction forming a parasitic diode DP is obtained between the source and the well of this transistor. When the kinetic energy of the rotor of the first motor becomes exhausted, the value of the voltage Vm decreases to a threshold whose value is typically of the order of 1 V, below which it is no longer adequate to sustain conduction of the parking transistor PMP. The parasitic diode DP, which is then conductive, allows the remainder of the energy delivered by the first motor to reach the second motor in the form of a current which flows through this diode.

We claim:

1. A control circuit for control of the flow of a current through a coil of an electric motor in order to produce a magnetic field which sets the motor into motion, said coil being coupled to an output terminal of the control circuit, said control circuit being coupled between a positive supply terminal and a negative supply terminal and comprises:

a power transistor of the NMOS type coupled between the negative supply terminal and the output terminal, and a power transistor of the PMOS type coupled between the output terminal and the positive supply terminal, said transistor being implanted in a well with an N-type diffusion, the conduction of the power transistors of the PMOS type and of the NMOS type being controlled by complementary signals, wherein the well of the power transistor of the PMOS type is electrically coupled to the positive supply terminal via an isolation diode having its anode connected to the positive supply terminal and its cathode connected to the well.

2. A control circuit as claimed in claim 1 wherein the negative supply terminal is connected to ground.

3. A control circuit as claimed in claim 1 wherein the drain of the NMOS power transistor is directly connected to the drain of the PMOS power transistor.

4. A control circuit for an electric motor having at least two motor terminals coupled to at least one coil to produce when a current flows through said coil a magnetic field which sets the motor into motion, the control circuit comprising: a control stage having at least two output terminals, each coupled to a respective one of the motor terminals, a positive supply terminal and a negative supply terminal, and at least two branches, each having a power transistor of the NMOS type arranged between the negative supply terminal and a respective one of the output terminals, and a power transistor of the PMOS type arranged between said respective output terminal and the positive supply terminal, which transistor is implanted in a well with N-type diffusion, the conduction of the power transistors of the PMOS type and of the NMOS type of a branch being controlled by complementary signals, wherein each of the wells of the power transistors of the PMOS type is electrically coupled to the positive supply terminal via an isolation diode having its anode connected to said positive supply terminal and its cathode connected to said well.

5. A control circuit as claimed in claim 4 wherein the negative supply terminal is connected to ground.

6. A control circuit as claimed in claim 4 wherein said electric motor is a three phase motor with three motor terminals and having three coils connected in a Y-configuration.

7. A control circuit as claimed in claim 4, wherein all of the wells of the power transistors of the PMOS type are coupled to the positive supply terminal via a common isolation diode.

8. A circuit for controlling an information storage disc via a first motor and a second motor, each motor having at least two terminals coupled to at least one coil so as to produce, when a current flows in said at least one coil, a magnetic field which sets the motor into motion, the first motor imposing a rotary movement upon the disc and the second motor moving an arm carrying at least one information read/write head over the surface of the disc, wherein said circuit comprises a first and a second control circuit each comprising;

a control stage having at least two output terminals, each coupled to a respective one of the motor terminals, a positive supply terminal and a negative supply terminal, at least two branches each having a power transistor of the NMOS type coupled between the negative supply terminal and a respective one of the output terminals, and a power transistor of the PMOS type coupled between said respective output terminal and the positive supply terminal, which transistor is implanted in a well with N-type diffusion, the conduction of the power transistors of the PMOS type and of the NMOS type of a branch being controlled by complementary signals, each of the output terminals of the first and the second control circuit being coupled to a respective one of the terminals of the first and the second motor, all of the wells of the power transistors of the PMOS type being coupled to the positive supply terminal via a common isolation diode having its anode connected to said positive supply terminal and its cathode connected to said well, one of the output terminals of the second control circuit being coupled to the cathode of the isolation diode via a further power transistor of the PMOS type which is turned on in case of a sudden power failure, between a first instant, at which the voltage on the positive supply terminal becomes zero, and a second instant, at which the voltage across the first motor becomes zero.

9. A circuit as claimed in claim 8, for controlling an information storage disc, wherein the well of the further power transistor is coupled to the drain of said transistor.

* * * * *